US008330036B1

(12) United States Patent
Park

(10) Patent No.: US 8,330,036 B1
(45) Date of Patent: Dec. 11, 2012

(54) METHOD OF FABRICATION AND STRUCTURE FOR MULTI-JUNCTION SOLAR CELL FORMED UPON SEPARABLE SUBSTRATE

(76) Inventor: Seoijin Park, Ellicott City, MD (US)

( * ) Notice: Subject to any disclaimer, the term of this patent is extended or adjusted under 35 U.S.C. 154(b) by 177 days.

(21) Appl. No.: 12/550,980

(22) Filed: Aug. 31, 2009

Related U.S. Application Data

(60) Provisional application No. 61/092,756, filed on Aug. 29, 2008.

(51) Int. Cl.
*H01L 31/00* (2006.01)
*H01L 31/042* (2006.01)

(52) U.S. Cl. ........ 136/249; 136/255; 136/256; 136/261; 136/262; 438/37; 438/57; 438/96; 438/98; 438/705; 438/718; 438/745; 438/752; 438/753; 257/53; 257/184; 257/190; 257/191; 257/200; 257/201

(58) Field of Classification Search .................. 136/249, 136/255, 256, 261, 262; 438/37, 57, 93, 438/98, 705, 718, 745, 752, 753; 257/53, 257/184, 190, 191, 200, 201
See application file for complete search history.

(56) References Cited

U.S. PATENT DOCUMENTS

| | | | | |
|---|---|---|---|---|
| 3,488,834 A * | 1/1970 | Baird | ............................ | 438/404 |
| 4,881,979 A * | 11/1989 | Lewis | ........................... | 136/249 |
| 5,053,083 A * | 10/1991 | Sinton | ........................... | 136/256 |
| 5,322,572 A * | 6/1994 | Wanlass | ........................... | 136/249 |
| 5,510,272 A * | 4/1996 | Morikawa et al. | ............... | 438/67 |
| 6,239,354 B1 * | 5/2001 | Wanlass | ........................... | 136/249 |
| 6,340,788 B1 * | 1/2002 | King et al. | ...................... | 136/261 |
| 6,690,041 B2 * | 2/2004 | Armstrong et al. | ............ | 257/184 |
| 6,951,819 B2 * | 10/2005 | Iles et al. | ....................... | 438/705 |
| 2007/0277873 A1 * | 12/2007 | Cornfeld et al. | ............... | 136/255 |
| 2008/0149173 A1 * | 6/2008 | Sharps | ........................... | 136/255 |
| 2008/0185038 A1 * | 8/2008 | Sharps | ........................... | 136/255 |
| 2008/0190886 A1 * | 8/2008 | Choi et al. | ....................... | 216/23 |
| 2008/0245409 A1 * | 10/2008 | Varghese et al. | ............... | 136/256 |
| 2009/0038679 A1 * | 2/2009 | Varghese et al. | ............... | 136/256 |
| 2009/0078309 A1 * | 3/2009 | Cornfeld et al. | ............... | 136/255 |
| 2009/0078310 A1 * | 3/2009 | Stan et al. | ....................... | 136/255 |
| 2009/0078311 A1 * | 3/2009 | Stan et al. | ....................... | 136/255 |

FOREIGN PATENT DOCUMENTS

EP 1863099 A2 * 12/2007

* cited by examiner

*Primary Examiner* — Jonathan Johnson
*Assistant Examiner* — Golam Mowla
(74) *Attorney, Agent, or Firm* — Rosenberg, Klein & Lee

(57) ABSTRACT

A method of fabricating a multi-junction solar cell on a separable substrate, and structure formed thereby are provided. The method comprises establishing a substrate having a semiconductive composition and forming a sacrificial layer upon the substrate. A solar cell portion is formed upon the sacrificial layer, such that the solar cell portion includes a plurality of multi junction layers. A stabilizing cell layer of semiconductor material is then formed on the solar cell portion, with the stabilizing cell layer having a predetermined thickness greater than a thickness of any individual one of the III-V multi junction layers. Etching is thereafter carried out to remove the sacrificial layer for releasing the solar cell portion from the substrate.

14 Claims, 2 Drawing Sheets

US 8,330,036 B1

METHOD OF FABRICATION AND STRUCTURE FOR MULTI-JUNCTION SOLAR CELL FORMED UPON SEPARABLE SUBSTRATE

RELATED APPLICATIONS

This Application is based on U.S. Provisional Application No. 61/092,756 filed 29 Aug. 2008.

BACKGROUND OF THE INVENTION

The present invention is generally directed to a method of fabrication and structure for a multi junction solar cell formed on a separable substrate. More specifically, the present invention is directed to a method of forming a plurality of III-V multi-junction solar cell devices having enhanced structural stability and energy conversion efficiency, in highly separable manner upon a reusable substrate. The present invention is also directed to such multi-junction solar cell structure formed thereby upon a separable substrate.

SUMMARY OF THE INVENTION

It is an object of the present invention to provide a method of fabrication and device structure for a multi-junction solar cell having enhanced stability to withstand stress induced during fabrication and use.

It is another object of the present invention to provide a method of fabrication and device structure for a multi junction solar cell having enhanced energy conversion efficiency.

It is yet another object of the present invention to provide a method of fabrication and device structure for a multi-junction solar cell having a range of frequency sensitivity extending to substantially cover a lower frequency range of the solar spectrum.

It is still another object of the present invention to provide a method of fabrication and device structure for a multi-junction solar cell epitaxially formed in highly separable manner upon a semiconductor substrate.

These and other objects are attained in a method of fabricating a multi-junction solar cell on a separable substrate implemented in accordance with the present invention. The method comprises establishing a substrate having a semiconductive composition and forming a sacrificial layer upon the substrate. A solar cell portion is formed upon the sacrificial layer, such that the solar cell portion includes a plurality of III-V multi-junction layers. A stabilizing cell layer of semiconductor material is then formed on the solar cell portion, with the stabilizing cell layer having a predetermined thickness greater than a thickness of any individual one of the III-V multi junction layers. Etching is thereafter carried out to remove the sacrificial layer for releasing the solar cell portion from the substrate.

In certain embodiments, the method further comprises after step of collectively patterning the solar cell portion and stabilizing cell layer into a plurality of pattern segments separated one from the other by a gap extending transversely therebetween to expose an upper portion of the sacrificial layer. The etchant material may then be diffused through the gap to the exposed upper portion of the sacrificial layer.

A multi junction solar cell structure separably formed on a semiconductor substrate may be implemented in accordance with the present invention. The structure comprises a sacrificial layer epitaxially formed on the substrate to be removable from the substrate by an etchant material. At least one solar cell segment is separably coupled to the substrate by such sacrificial layer. Each solar cell segment includes a solar cell portion having a plurality of III-V multi-junction layers is epitaxially formed on the sacrificial layer. Each solar cell segment further includes a stabilizing cell layer epitaxially formed on the solar cell portion, as a cell layer of semiconductor material including Germanium (Ge) PN junction and having a predetermined thickness greater than a thickness of any individual one of the III-V multi junction layers. Each solar cell segment also includes a metal layer formed on the stabilizing cell layer. A carrier is coupled to the metal layer of the solar cell segment.

In certain embodiments, the structure comprises a plurality of solar cell segments separably coupled to the substrate by the sacrificial layer, such that the solar cell segments are disposed in a patterned arrangement over the sacrificial layer. Adjacent ones of the solar cell segments are separated one from the other by a gap extending transversely therebetween to expose an upper portion of the sacrificial layer. Each gap is so configured that it serves to guide etchant material therethrough to an exposed upper portion of the sacrificial layer.

DETAILED DESCRIPTION OF THE PREFERRED EMBODIMENTS

Figure 1:
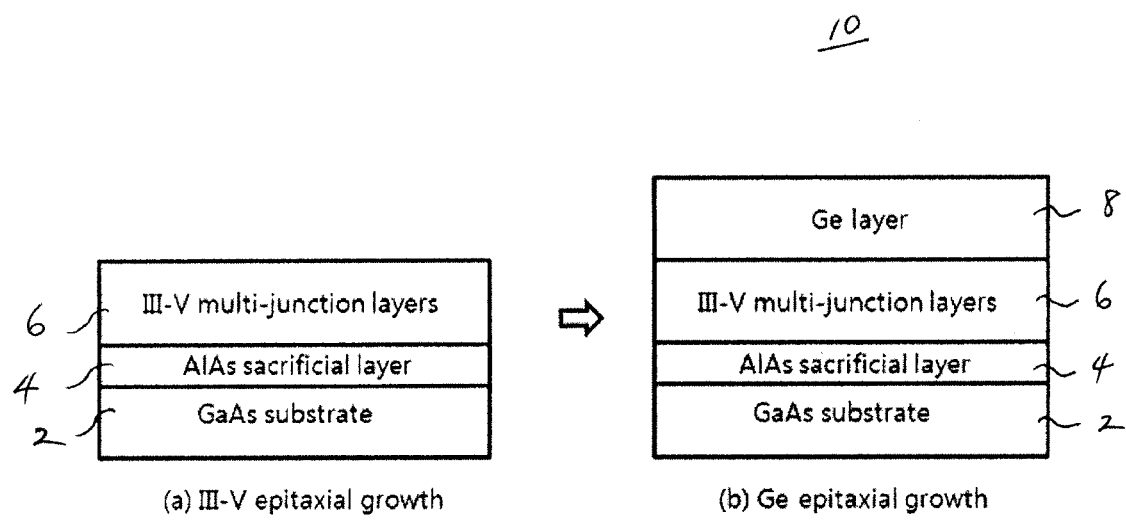
FIG. 1(a) is a schematic diagram illustrating a portion of a device structure during a stage of fabrication in accordance with an exemplary embodiment of the present invention.
FIG. 1(b) is a schematic diagram illustrating a portion of a device structure in the embodiment of FIG. 1(a) during a further stage of fabrication.

III-V multi junction solar cells generally have the highest conversion efficiency of readily available solar cell types. However, the costs of III-V solar cells tend to be relatively high compared to other types of solar cells. III-V solar cell films are typically grown on expensive substrates made of such semiconductor materials as GaAs, Ge, and InP. To minimize production costs, the expensive substrates may be reused, since the substrates are only needed to obtain high quality epitaxial layers. They do not form a functional part of the resulting solar cell device. Nor are they required for use as a solar cell thin film carrier for post-growth processing.

After epitaxial growth of the functional device layers, the substrate may be separated for reuse, via a selective etching process. In connection with this process, a sacrificial layer is grown between the solar cell thin film layer and GaAs substrate, and the layer is selectively etched away without etching the solar cell thin film or substrate materials. The method is typically called the Epitaxial Lift-Off (ELO) technique. As a sacrificial layer for III-V solar cell film, single crystalline aluminum arsenide layer (AlAs) or aluminum gallium arsenide layer (AlGaAs) is deposited on a GaAs substrate before any deposition of the solar cell layers. After deposition of the solar cell layers and additional fabrication processes such as metal deposition, the grown wafer is placed in a hydrogen fluoride (HF) solution; and, the HF solution selectively etches away the AlAs sacrificial layer. After the AlAs layer is completely removed by the selective wet etching, the substrate and the III-V solar cell film are separated. The separated solar cell film may be bonded to a suitable carrier material for further processing.

The carrier material may be of such materials as plastic, glass, ceramic, metal, or semiconductor. Generally, the thickness of III-V solar cell film is a few micrometers. It is difficult to handle the thin film by itself upon separation from the substrate. The thin film is also easily damaged. Therefore, the thin film is bonded on a suitable carrier before separation from the substrate, before HF etching. As the carrier material and bonding material are subjected to HF solution together with the thin film during epitaxial liftoff, the carrier material and bonding material are selected to be resistant to etching by the HF solution.

For epitaxial liftoff techniques, multi-junction III-V solar cell structures had until recently only consisted of a few micrometer III-V materials. Even when bonded on a carrier, the thin film proved too thin for many applications, and often found to be vulnerable to cracking. Thermal expansion coefficients of III-V thin films generally do not match those of typical carrier materials. During fabrication processes and during use of the thin film in various environments, thermal cycles invariably exist. If the thermal expansion coefficient of the solar cell thin film is different from that of the carrier material, stress is induced on the thin film. If the thin film can not endure the resulting stress, defects are generated until finally cracking occurs in the thin film.

In addition to the carrier material, the bonding material used to bond the carrier and the thin film may also induce stress on the thin film. Generally, a bonding material is provided in liquid or gel form during the bonding process, and cures to a solid after bonding. There is volume shrinkage when such liquid is solidified. This reduction in volume tends to induce compressive stress on the III-V thin film, which may then generate defects and eventual cracking around the film edge. The induced stress on the thin film depends on the volume of the bonding material and the contact area of the thin film on the bonding material layer.

A few micrometer III-V solar cell thin film is highly vulnerable to such induced stress from the carrier and bonding materials. This makes it difficult to obtain desirable levels of reliability. There are various approaches to improve the reliability nonetheless. For example, the thickness of the thin film may be increased. However, the cost growing III-V thin film is very high. The cost to grow the thin film up to a thickness sufficient to obviate the reliability hazard may very well exceed the high cost of the substrate, negating what savings were to be realized by using the epitaxial liftoff in the first place.

Another problem of the current epitaxial liftoff technology is increasing energy conversion efficiency. To obtain high energy conversion efficiency, it is desirable that the sensitivity of the solar cell thin film's III-V materials cover the whole solar spectrum. There are III-V materials whose sensitivity extends to cover the low frequency side of the solar spectrum as well. However, the materials that provide sufficient low frequency coverage of the solar spectrum tend to have larger lattice constants than that of a GaAs substrate. To grow such lattice mismatched materials on the GaAs substrate, a thick buffer layer would be required. Even then, high reliability would be difficult to obtain. A thick buffer layer increases overall cell cost, and tends to be prohibitive for most epitaxial liftoff applications. Gains in the energy conversion efficiency using this approach are also limited because the number of lattice-mismatched layers that can actually be inserted in the solar cell structure is limited.

Epitaxial liftoff is very attractive technology to reduce III-V solar cell production costs. However, as mentioned above, reliability issues persist, and potential increases in the energy conversion efficiency remain limited. Growth of thick III-V film to improve reliability unduly increases production costs and makes it difficult to justify using the epitaxial liftoff as a means for cost reduction.

Such reliability and energy conversion issues of the epitaxial liftoff are addressed in accordance with certain aspects of the present invention. An exemplary embodiment of the structure and method employing epitaxial liftoff in accordance with the present invention are illustrated in FIG. 1. Referring to FIG. 1, device structure 10 includes GaAs substrate 2, a sacrificial layer 4 formed of AlAs, AlGaAs or other such suitable semiconductive material, III-V multi-junction cell layers 6, and a Germanium (Ge) cell layer 8.

Preferably, a stabilizing Ge cell layer 8 is thicker than 5 µm. This thick Ge cell layer serves dual purposes. One is that the relatively thick layer 8 provides stability to render the resulting solar cell film of the layers 6 less vulnerable to the stress induced by carrier and bonding materials. The other is that the Ge material of cell 8 extends coverage of the solar spectrum to include the lower frequency regions. This increases the energy conversion efficiency over that realized by the III-V multi-junction layers 6 alone.

The stabilizing Ge epitaxial cell layer 8 may be formed in any suitable manner over the layers 6. For example, cell layer 8 may be continuously grown in the same growth chamber via such techniques as molecular beam epitaxy (MBE), metal organic vapor phase deposition (MOCVD), and chemical beam epitaxy (CBE), and the like after III-V epitaxial layer growth. Alternatively, the stabilizing cell layer 8 may also be grown in a different growth chamber after III-V layer growth. The different growth chamber may be of chemical vapor deposition (CVD), high vacuum CVD, or other such type which yields a Ge growth cost that is less than the III-V material growth cost. With CVD technology, a high quality Ge epitaxial cell layer may be grown with negligible Ga and As out-diffusion. The Ge cell layer may be epitaxially grown in a low cost growth chamber after thin epitaxial Ge cell layer is initially grown by a suitable III-V epitaxial growth technique known in the art such as molecular beam epitaxy (MBE), metal organic vapor phase deposition (MOCVD), chemical beam epitaxy (CBE) or the like. After Ge epitaxial growth, a carrier 12 is preferably bonded to the Ge cell layer 8.

When the GaAs substrate is to be reused after a thick AlAs sacrificial layer is grown thereon, the bonded wafer which results from the thin film fabrication process is dipped into HF solution. Etching then begins on the exposed sidewell of the wafer and gradually moves to the center of the wafer. This is a very slow process, since etching occurs only from the exposed lateral sides of the sacrificial layer. This etching process rate may be accelerated by using a thicker AlAs sacrificial layer to increase the laterally exposed surface area for etching; however, this raises obvious dimensional/cost limitations. Also, if a flexible carrier is used, the carrier may be bent to aid the diffusion mechanism and thereby increase the etching process rate. However, the approach is only workable with flexible carrier materials, and is not suitable for high reliability and high volume manufacturing.

In accordance with one aspect of the present invention, the etching process is aided by exposing portions of the sacrificial layer's upper surface which would otherwise remain covered by the other layers to the etchant material. As illustrated in the exemplary embodiments of FIG. 2(a)-2(b), one or more gaps 3 are formed between patterned cell segments 10a-10d in the device structure 100. The gaps 3 provide additional paths by which HF etchant may diffuse to the AlAs layer 4. Preferably, the HF etchant diffuses into corresponding holes 12a-12d formed in the given carrier 12, then through the gaps 3 between the patterned cell segments 10a-10d to reach to the upper portion 4' of the AlAs layer 4. The etching byproducts then diffuse back out through the gaps 3 and holes 12a-12d.

Figure 2:
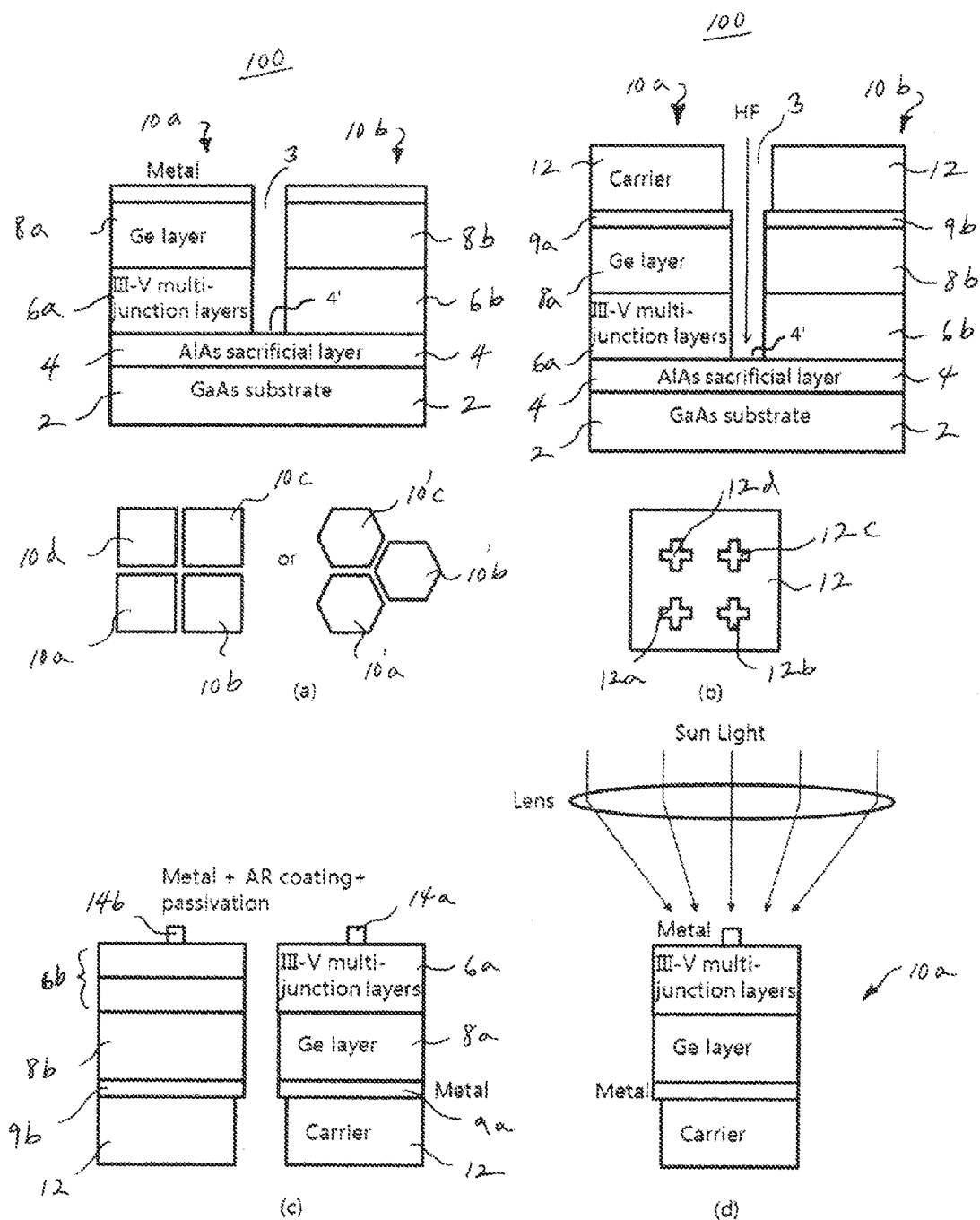
FIG. 2(a) is a schematic diagram illustrating a patterned arrangement of solar cell segments in a device structure formed in accordance with various exemplary embodiments of the present invention, during a stage of fabrication, additionally showing plan views of the solar cell segments.
FIG. 2(b) is a schematic diagram illustrating the patterned arrangement of solar cell segments in a device structure in the embodiment of FIG. 2(a) during a further stage of fabrication, additionally showing a plan view of the carrier.
FIG. 2(c) is a schematic diagram illustrating individual solar cell segments diced one from the other following a further stage of fabrication in the embodiment of FIG. 2(b); and, FIG. 2(d) is a schematic diagram illustrating an exemplary use of an individual solar cell segment shown FIG. 2(c).

Compared with conventional techniques, more surface area of the AlAs layer 4 is initially exposed to HF etchant. It becomes easier for the etchant and byproducts to diffuse in and out from the layer 4, which increases the etching process rate significantly. As illustrated in FIG. 2(a), each segment 10a-10d and its metal electrode layer may be deposited in the patterned arrangement, or the deposited segment and its metal layer may be patterned by forming the gaps 3 afterwards using any suitable processing measures known in the art. The pattern can be square or hexagonal (10'a-10'c) in shape as shown in FIG. 2(a). The cell size may be varied, for instance, from approximately ten micrometers to several centimeters. The gap 3 between cell segments 10a-10d is preferably less than 20% of the cell size.

Preferably, the patterned wafer is etched using dry etching or wet etching techniques. The material of the Ge cell layer 8 and multi-junction III-V semiconductor layers 6 at the gaps 3 are completely etched away to separate the individual cell segments 10a-10d, to thereby expose the upper portions 4' of AlAs layer 4 there to the etchant material. The metal layer 9a, 9b may be deposited on each cell segment after these portions of the Ge cell layer 8 and multi-junction III-V semiconductor layers 6 are etched away to define the gaps 3. Any suitable material (not shown) may be used as a mask for this etching of these materials.

After the etching of the Ge cell and multi-junction III-V semiconductor cell layers 8, 6 and subsequent deposition of the metal layers 9a, 9b, a carrier 12 is bonded on the solar cell film side. As shown in FIG. 2(b), the carrier is preferably formed with patterned holes 12a-12d that provide a way for HF etchant material to penetrate the carrier 12 toward the AlAs layer 4 from the backside of the carrier 12. The sizes of the patterned holes 12a-12d are comparable to those of the gaps 3. Where necessary, the carrier is coated with metals, and the metal side is attached to the metal electrode 9a-9b of the solar cell segments 10a-10d preferably using metal soldering or the like. If a metal carrier is used, such metal coating is not necessary. If the metal electrode on each patterned cell segment is connected to each other, the metal coating on the carrier is also not necessary. In that case, the film and the carrier may be bonded using materials other than soldering metals.

After this bonding, the resulting bonded wafer is preferably placed into HF etching solution, and the solution is agitated. HF diffuses into the patterned holes of the carrier 12, as well as contacting the exposed lateral sides of the sacrificial layer 4, to rapidly etch away the AlAs layer from multiple exposed sides. The etching byproducts diffuse out in reverse manner. After complete removal of the AlAs layer 4, the GaAs substrate is detached from the III-V and Ge films 6, 8.

Following this, the second electrode 14a-14b pattern is defined using a photoresist in accordance with a suitable technique known in the art. A metal pattern is formed by the liftoff as shown in FIG. 2(c). After forming the second electrode, passivation of the etched sidewalls of hexagonal or otherwise configured cell segments 10a-10d is preferably carried out, along with antireflective (AR) coating on the resulting device surface. A suitable $Al_2O_3$ or ZnO layer for the sidewall passivation and AR coating may be used. Using ion-beam assisted e-beam evaporation with tilted loading, passivation and AR coating may be accomplished at the same time. Finally, AR coating film on the electrode part designated for electrical contact is removed by mask patterning using a photoresist and etching.

After finishing the fabrication process, the patterned individual cell segments may can be cut apart (diced) from the others and assembled with a focusing lens for use as illustrated, for example, in FIG. 2(d). If the electrodes of multiple cells are interconnected, many patterned cells may be used collectively as a single solar cell.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of flows or processing steps may be reversed or interposed, all without departing from the spirit or scope of the invention as defined in the appended Claims.

What is claimed is:

1. A method of fabricating a multi junction solar cell on a separable substrate comprising the steps of:
   a. establishing the separable substrate to have a semiconductive composition;
   b. forming a sacrificial layer upon said substrate;
   c. forming a solar cell portion upon said sacrificial layer, said solar cell portion including a plurality of III-V multi-junction layers;
   d. forming a stabilizing cell layer of semiconductor material on said solar cell portion external to said III-V multi-junction layers, said stabilizing cell layer having a predetermined thickness greater than a thickness of any individual one of said III-V multi-junction layers, wherein said stabilizing cell layer is formed of p-doped and n-doped layers of germanium (Ge) material;
   e. collectively patterning said solar cell portion and stabilizing cell layer into a plurality of pattern segments separated one from the other by a gap extending transversely therebetween to expose an upper portion of said sacrificial layer; and,
   f. etching to remove said sacrificial layer for releasing said solar cell portion from said substrate.

2. The method as recited in claim 1, wherein said predetermined thickness of said stabilizing cell layer is greater than 5 micrometers.

3. The method as recited in claim 1, wherein said sacrificial layer, solar cell portion, and stabilizing cell layer are each formed by epitaxial growth.

4. The method as recited in claim 1, further comprising in step e diffusing an etchant material through said gap to said exposed upper portion of said sacrificial layer.

5. A method of fabricating a multi-junction solar cell on a separable substrate comprising the steps of:
   a. establishing the separable substrate to have a semiconductive composition;
   b. forming a sacrificial layer upon said substrate;

c. forming a solar cell portion upon said sacrificial layer, said solar cell portion including a plurality of III-V multi-junction layers;

d. forming a stabilizing cell layer of semiconductor material on said solar cell portion, said stabilizing cell layer having a predetermined thickness greater than a thickness of any individual one of said III-V multi-junction layers; and, e. collectively patterning said solar cell portion and stabilizing cell layer into a plurality of pattern segments separated one from the other by a gap extending transversely therebetween to expose an upper portion of said sacrificial layer, etching to remove said sacrificial layer for releasing said solar cell portion from said substrate, and diffusing an etchant material through said gap to said exposed upper portion of said sacrificial layer;

wherein said stabilizing cell layer is formed of p-doped and n-doped layers of germanium (Ge) material;

wherein a conductive layer is disposed on said stabilizing cell layer of each said patterned segment, and a carrier is formed collectively over said conductive layers of said patterned segments, said carrier having formed therein a plurality of patterned holes each communicating with at least a portion of one said gap.

6. The method as recited in claim 5, wherein a conductive contact is formed on an exposed side of said solar cell portion of each said patterned segment.

7. The method as recited in claim 3, wherein said sacrificial layer includes a material selected from the group consisting of: AlAs and AlGaAs.

8. The method as recited in claim 7, wherein said substrate includes a material selected from the group consisting of: GaAs, Ge, and InP material.

9. A method of fabricating a multi-junction solar cell on a detachable substrate comprising the steps of:

a. establishing the detachable substrate to have a semiconductive composition;

b. epitaxially growing a sacrificial layer upon said substrate;

c. epitaxially growing a solar cell portion upon said sacrificial layer, said solar cell portion including a plurality of III-V multi-junction layers;

d. epitaxially growing a stabilizing cell layer of semiconductor material on said solar cell portion external to said III-V multi-junction layers, said stabilizing cell layer having a predetermined thickness greater than a thickness any individual one of said III-V multi-junction layers;

e. collectively patterning said solar cell portion and stabilizing cell layer into a plurality of pattern segments separated one from the other by a gap extending transversely therebetween to expose an upper portion of said sacrificial layer; and, f. etching to remove said sacrificial layer to release said solar cell portion from said substrate, said etching including diffusing an etchant material through said gap to said exposed upper portion of said sacrificial layer.

10. The method as recited in claim 9, wherein said stabilizing cell layer is formed of p-doped and n-doped layers of germanium (Ge) material.

11. The method as recited in claim 10, wherein said predetermined thickness of said stabilizing cell layer is greater than 5 micrometers.

12. A method of fabricating a multi-junction solar cell on a detachable substrate comprising the steps of:

a. establishing the detachable substrate to have a semiconductive composition;

b. epitaxially growing a sacrificial layer upon said substrate;

c. epitaxially growing a solar cell portion upon said sacrificial layer, said solar cell portion including a plurality of III-V multi-junction layers;

d. epitaxially growing a stabilizing cell layer of semiconductor material on said solar cell portion, said stabilizing cell layer having a predetermined thickness greater than a thickness any individual one of said III-V multi-junction layers;

e. collectively patterning said solar cell portion and stabilizing cell layer into a plurality of pattern segments separated one from the other by a gap extending transversely therebetween to expose an upper portion of said sacrificial layer; and, f. etching to remove said sacrificial layer to release said solar cell portion from said substrate, said etching including diffusing an etchant material through said gap to said exposed upper portion of said sacrificial layer;

wherein said stabilizing cell layer is formed of p-doped and n-doped layers of germanium (Ge) material, and said predetermined thickness of said stabilizing cell layer is greater than 5 micrometers;

wherein a metal layer is disposed on said stabilizing cell layer of each said patterned segment; a carrier is formed collectively over said metal layers of said patterned segments, said carrier having formed therein a plurality of patterned holes each at least partially aligned with at least one said gap; and, a metal contact is formed on an exposed side of said solar cell portion of each said patterned segment.

13. The method as recited in claim 12, wherein said sacrificial layer includes a material selected from the group consisting of: AlAs and AlGaAs.

14. The method as recited in claim 13, wherein said substrate includes a material selected from the group consisting of: GaAs, Ge, and InP material.

* * * * *